(12) United States Patent
Mizutani et al.

(10) Patent No.: US 7,732,121 B2
(45) Date of Patent: Jun. 8, 2010

(54) NEAR-FIELD EXPOSURE METHOD

(75) Inventors: Natsuhiko Mizutani, Tokyo (JP); Yasuhisa Inao, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/758,958

(22) Filed: Jun. 6, 2007

(65) Prior Publication Data
US 2007/0287100 A1 Dec. 13, 2007

(30) Foreign Application Priority Data
Jun. 7, 2006 (JP) .............................. 2006-158012

(51) Int. Cl.
*H01L 21/70* (2006.01)
*G03F 7/20* (2006.01)

(52) U.S. Cl. ...................... 430/311; 430/322; 430/313

(58) Field of Classification Search ................ None
See application file for complete search history.

(56) References Cited

U.S. PATENT DOCUMENTS

| | | | |
|---|---|---|---|
| 6,171,730 B1 | 1/2001 | Kuroda et al. | |
| 6,720,115 B2 | 4/2004 | Inao et al. | ...................... 430/5 |
| 6,869,737 B2 | 3/2005 | Suzuki et al. | |
| 7,001,696 B2 | 2/2006 | Inao et al. | ...................... 430/5 |
| 7,050,144 B2 | 5/2006 | Mizutani et al. | ............. 355/19 |
| 7,144,682 B2 | 12/2006 | Inao et al. | .................. 430/311 |
| 7,144,685 B2 | 12/2006 | Mizutani et al. | ............ 430/311 |
| 2005/0057752 A1 | 3/2005 | Inao et al. | ................... 356/400 |
| 2005/0063445 A1 | 3/2005 | Mizutani et al. | .............. 372/94 |
| 2005/0064301 A1 | 3/2005 | Yamaguchi et al. | ............ 430/5 |
| 2005/0064303 A1 | 3/2005 | Yamada et al. | ................. 430/5 |
| 2005/0147922 A1 | 7/2005 | Suzuki et al. | |
| 2006/0003233 A1 | 1/2006 | Yamaguchi et al. | ........... 430/5 |
| 2006/0003269 A1 | 1/2006 | Ito et al. | ..................... 430/323 |
| 2006/0110693 A1 | 5/2006 | Kuroda et al. | ............... 430/394 |
| 2006/0124834 A1 | 6/2006 | Mizutani et al. | ............ 250/216 |
| 2006/0160036 A1 | 7/2006 | Mizutani | .................... 430/396 |
| 2007/0065734 A1 | 3/2007 | Inao et al. | ....................... 430/5 |
| 2007/0082279 A1 | 4/2007 | Mizutani et al. | .............. 430/30 |

FOREIGN PATENT DOCUMENTS

| | | |
|---|---|---|
| JP | 8-179493 | 7/1996 |
| JP | 2004-297032 | 10/2004 |

*Primary Examiner*—Daborah Chacko Davis
(74) *Attorney, Agent, or Firm*—Fitzpatrick, Cella, Harper & Scinto

(57) ABSTRACT

A near-field exposure method includes closely contacting an exposure mask having a light blocking film with small openings, to a photoresist layer formed on a substrate having surface unevenness, and projecting the exposure light of the exposure light source onto the exposure mask so that the photoresist is exposed based on near-field light escaping from the small openings, wherein the near-field exposure is carried out under a condition that a contact region where the light blocking film and the photoresist layer are in contact with each other and a liquid region filled with a liquid between the light blocking film and the photoresist layer coexist between the light blocking film and the photoresist layer.

6 Claims, 2 Drawing Sheets

NEAR-FIELD EXPOSURE METHOD

FIELD OF THE INVENTION AND RELATED ART

This invention relates to a near-field exposure method. More particularly, the invention concerns a near-field exposure method in which a mask for exposure is placed close to a substrate to be exposed, and the substrate is exposed by use of near-field light escaping from very small openings formed in the exposure mask.

With increasing capacity of semiconductor memories and increasing speed and density of CPUs, further improvements in microprocessing technology based on optical lithography have been required as a crucial key.

Generally, optical lithography machines have a microprocessing limit of around the wavelength of a light source. Because of this, shortening of the wavelength has been attempted, such as use of a near-ultraviolet radiation laser for a light source of optical lithography machines, for example. Currently, the microprocessing resolution of around 0.1 μm order has been enabled.

Although the optical lithography has advanced with respect to the microprocessing resolution, there still remain some problems to be solved to enable a microprocessing resolution of less than 0.1 μm; namely, further shortening of the wavelength of a light source and development of lenses usable with such a wavelength region, for example.

In recent years, a near-field exposure method has been suggested as one method to solve these problems. For example, Japanese Laid-Open Patent Application No. 08-179493 proposes a method in which a prism is set up for an optical mask, and light is caused to be incident on the mask with an angle of total reflection, such that a pattern of the optical mask is transferred to a resist simultaneously by use of evanescent light escaping from the total reflection surface.

In addition, U.S. Pat. No. 6,171,730 proposes a method in which a mask is made of an elastic material, such that the mask can be elastically deformed to follow the resist surface shape, and the exposure based on a near-field is carried out while keeping the mask entire surface closely contacted to the resist surface.

On the other hand, Japanese Laid-Open Patent Application No. 2004-297032 proposes a near-field exposure method wherein a chromium membrane and an upper resist are contacted to each other through a pure-water film.

However, these methods may cause the following inconveniences.

Namely, when a resist film is formed on a non-flat substrate and near-field exposure is performed thereto, the resist film surface may not be completely flat, and it causes a difficulty of controlling the unevenness of the exposure state.

Furthermore, particularly, in the method disclosed in U.S. Pat. No. 6,171,730, if the period of unevenness of the substrate is small, a large force has to be applied to the mask to make the mask entire surface completely adhered to the resist surface, based on the elastic deformation of the mask. This makes the device structure quite complicated, and causes a decrease of machining precision due to the deformation.

SUMMARY OF THE INVENTION

In accordance with an aspect of the present invention, there is provided a near-field exposure method, comprising closely contacting an exposure mask, having a light blocking film with small openings of a size not greater than a wavelength of exposure light of an exposure light source, to a photoresist layer formed on a substrate having surface unevenness, and projecting the exposure light of the exposure light source onto the exposure mask so that the photoresist is exposed based on near-field light escaping from the small openings, wherein the near-field exposure is carried out while keeping both a contact region in which the light blocking film and the photoresist layer are in contact with each other, and a liquid region in which an interspace between the light blocking film and the photoresist layer is filled with a liquid, coexisting between the light blocking film and the photoresist layer.

In accordance with another aspect of the present invention, there is provided a device manufacturing method, comprising an exposure step based on a near-field exposure method as recited above, a developing step for developing a photoresist layer exposed by the exposure step, to provide a transfer mask, and a processing step for processing a substrate by use of the transfer mask provided by the developing step.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1A:
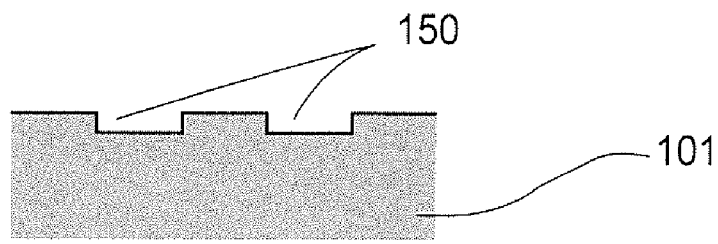
FIGS. 1A-1D are schematic and sectional views, respectively, for explaining a near-field exposure method in an embodiment of the present invention.

Preferred embodiments of the present invention will now be described with reference to the attached drawings.

A near-field exposure method according to an embodiment of the present invention may include closely contacting an exposure mask, having a light blocking film with small openings of a size not greater than a wavelength of exposure light of an exposure light source, to a photoresist layer formed on a substrate having surface unevenness, and projecting the exposure light of the exposure light source onto the exposure mask so that the photoresist is exposed based on near-field light escaping from the small openings, wherein the near-field exposure may be carried out while keeping both a contact region in which the light blocking film and the photoresist layer are in contact with each other, and a liquid region in which an interspace between the light blocking film and the photoresist layer is filled with a liquid, coexisting between the light blocking film and the photoresist layer.

In one preferred form of the present invention, the coexistence of the contact region and the liquid region may be provided by a process that includes forming a film of liquid on the photoresist layer, and shifting the light blocking film toward the photoresist film until a portion of the light blocking film pushes aside the film of liquid and directly contacts the photoresist layer, while confining the film of liquid in an interspace remaining between the light blocking film and the photoresist layer coming closer to each other.

The surface unevenness of the substrate may range from 10 nm to 1 μm in height.

The photoresist layer of the substrate may be comprised of a shape buffer layer for smoothing the surface unevenness, and a photosensitive resist layer formed on the shape buffer layer.

Based on the surface smoothing by the shape buffer layer, a level difference of the surface unevenness of the substrate may be reduced to a half or less of a reachable depth of the near-field from the exposure mask, in an upper limit value.

The liquid may be a transparent liquid.

A device manufacturing method according to an embodiment of the present invention may include an exposure step based on a near-field exposure method as recited above, a developing step for developing a photoresist layer exposed by the exposure step, to provide a transfer mask, and a processing step for processing a substrate by use of the transfer mask provided by the developing step.

Briefly, in accordance with these embodiments of the present invention, a unique and an improved near-field exposure method, by which fluctuation of an exposure state of the near-field exposure due to surface unevenness of the substrate is reduced effectively, is accomplished.

Next, a near-field exposure method according to an embodiment of the present invention will be explained in detail.

FIGS. 1A-1D are schematic views for explaining a near-field exposure method of this embodiment. Denoted in FIG. 1A at 101 is a substrate to be processed. This workpiece substrate 101 has just a little surface unevenness 150 already formed thereon due to the influence of preceding manufacturing processes, for example, having been made to it. The surface unevenness to be handled by the present invention will be those formed on the substrate 101 surface, and having a height ranging from about 10 nm to 1 μm. The workpiece substrate 101 may be one formed with a multilayer film, or one which is in the middle of manufacture of a device structure, using various materials.

Figure 1B:
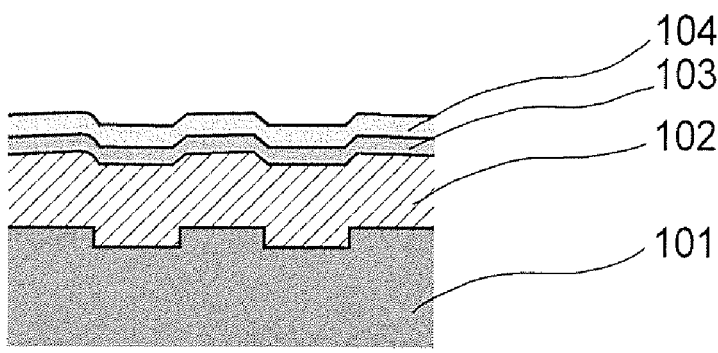

For carrying out the near-field exposure method, at first, a layer of a photoresist material is formed on a workpiece substrate having such a surface unevenness as shown in FIG. 1B. For those workpiece substrates 101 having such a surface unevenness, use of a multilayer resist method based on two levels or three levels is preferable. Although FIG. 1A shows an example using a multi-level resist layer, the resist layer to be used with the present invention is not limited to such a multilayer.

Here, as an example, a two-level resist method using a structure having a bottom resist layer formed on a substrate and being removable by dry etching, and a top resist layer applied thereto and having a tolerance to oxygen dry etching, may be used. Furthermore, a three-level resist method using a structure having a bottom resist layer formed on a substrate and being removable by dry etching, a second layer having a tolerance to oxygen plasma etching, and a top photosensitive resist layer applied onto it, may preferably be used.

Now, an embodiment based on the three-level resist method will be explained.

Denoted at 102 is a non-photosensitive shape buffer layer (lower resist layer). The coating of this shape buffer layer 102 may be formed on an arbitrary substrate by using any known coating machines or methods such as, for example, a spin coater, a dip coater and a roller coater. The film thickness can set as desired in accordance with the use. Generally, the film material may desirably be applied to provide a film thickness of 0.1-5 μm after baking. The shape buffer layer 102 may be baked with a temperature of 90-500 degrees Celsius, more preferably, 150-300 degrees Celsius. For this baking process, heating means, such as a hot plate or a hot-air drying machine, may be used.

With the provision of such a shape buffer layer 102 as described, the original surface unevenness of the workpiece substrate is buried, and the surface level difference is lowered thereby. A surface level difference of 10 nm or less can be accomplished by this. Here, as for the upper limit value of the surface level difference to be accomplished by the shape buffer layer 102, it may desirably be approximately a half or less of the reachable depth of the near-field from the exposure mask. Since the near-field light reachable depth is determined by the pitch of a pattern, and the like, flattening may be carried out in accordance with a pattern to be exposed, to attain the flatness satisfying the upper limit value for the surface unevenness of the shape buffer layer 102.

Subsequently, on this shape buffer layer 102, a film having a tolerance to oxygen dry etching is formed as an intermediate layer (intermediate resist layer) 103. This layer may be, for example, a metal oxidation film formed through a spin-on-glass (SOG) method or a sol-gel process, or an SiOx film formed by a vacuum film forming technology. A typical film thickness thereof may be 5-50 nm.

Furthermore, on this intermediate layer 103, a resist layer 104 having photosensitivity is formed with a thickness of 10-100 nm. As regards this photosensitive layer 104, a photoresist film having a sensitivity with respect to the wavelength to use for exposure may be used. The coating of this photoresist film can be made on the intermediate layer 103, using any known coating machines or methods such as, for example, a spin coater, a dip coater and a roller coater.

Figure 1C:
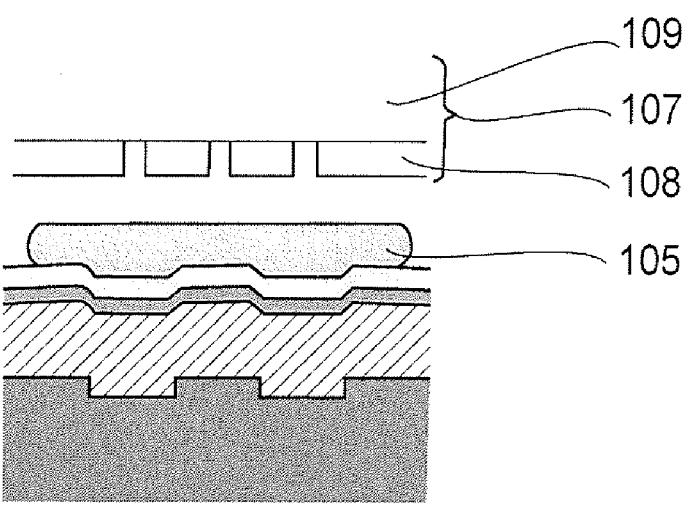

Subsequently, as shown in FIG. 1C, a liquid film 105 is formed on the photoresist film. As for the liquid, it should be one not dissolving the photoresist film or not corroding the mask. For example, pure water or high refractive-index liquid materials used for liquid-immersion type projection exposure may be applied.

The coating of this liquid film can be made using any known coating machines or methods such as, for example, a spin coater, a dip coater and a roller coater. As an alternative, a liquid may be supplied onto the photoresist film from a liquid discharging device provided in the exposure apparatus.

Subsequently, a near-field exposure mask 107 is moved close to the liquid film 105 formed on the photoresist film as described above. The near-field exposure mask 107 is comprised at least of a transparent base material 109 and a light blocking film 108 formed at the lower surface of the base material 109. The light blocking film 108 is formed with minute openings of a size not greater than the exposure wavelength corresponding to a desired pattern shape.

Figure 1D:
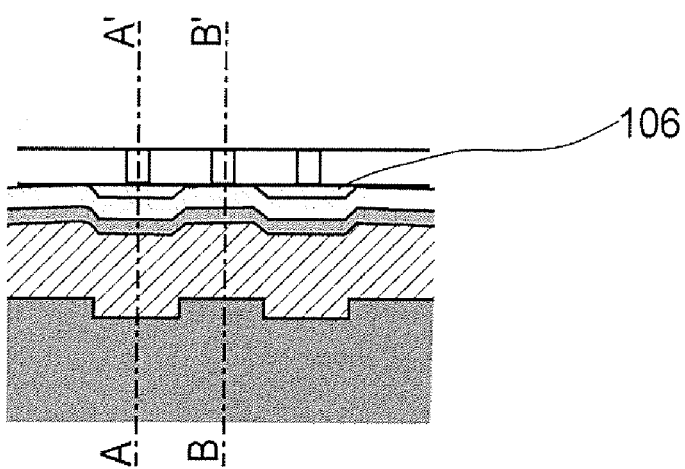

As shown FIG. 1D, the near-field exposure mask 107 is brought into contact with the upper part of the photoresist film. More specifically, as shown in FIG. 1D, the near-field exposure mask 107 is brought close to a photoresist film until, at least in a portion wherein the height of the resist film is higher than the peripheral area around it, the liquid film 105 is pushed aside, and the mask and the photoresist film are directly contacted to each other.

This can be done by, for example, boosting the pressure inside the pressure container to which the near-field exposure mask 107 is attached. The state after the contact is shown in FIG. 1D at a line B-B'.

Here, in the portion where the height of the resist film is lower than the peripheral area around it, the liquid film 105 is never completely taken away therefrom. Hence, in that portion, the liquid remains between the near-field exposure mask 107 and the photoresist film. In other words, a liquid is being confined in the interspace between the light blocking film 109 and the photoresist film.

This state is shown in FIG. 1D at a line A-A'. Denoted at 106 is the liquid being confined in the gap between the mask and the photoresist.

In this state, light from the light source is projected to the near-field exposure mask 107, and an optical latent image is formed on the photoresist film. After this, the exposed photosensitive layer 104 is dip-developed with a 2.38% aqueous solution of TMAH, whereby a pattern is formed afterwards.

Subsequently, dry etching is carried out by using this upper resist as an etching mask and using a mixed gas of SF6 and CHF3, whereby a pattern is transferred to an $SiO_2$ layer of the intermediate layer 103. After this, by using this intermediate layer as an etching mask, the non-photosensitive shape buffer layer 102 is etched based on a mixed gas of oxygen and argon, whereby a pattern is transferred thereto.

With the procedure described above, the pattern of the near-field exposure mask can be uniformly produced on the entire surface of the workpiece substrate having surface unevenness.

The light contrast to be provided in the resist film in the procedure of the exposure process made under the situations described above was analyzed based on the following models.

First of all, for model A, in accordance with the contact situation along the line A-A', the following analysis was made. Namely, in the model A of a multilayer structure that comprises, from the top, an SiN film (mask base material), a Cr film (light blocking film) having openings, an intermediate liquid layer sandwiched therebetween, a photoresist film (130 nm thickness) and a baking silicon substrate, the electromagnetic field around the small openings was analyzed. Here, the thickness of the liquid layer was set as 10 nm, for example.

Additionally, in accordance with the situation of contact without having intervention of a liquid, along the line B-B, analysis was carried out in relation to model B, wherein the thickness of the intermediate liquid layer in model A was reduced to zero. Furthermore, for comparison, analysis was made with regard to a case (model C) wherein there was no intermediate liquid and the gap between the resist and the mask was filled with air.

Figure 2:
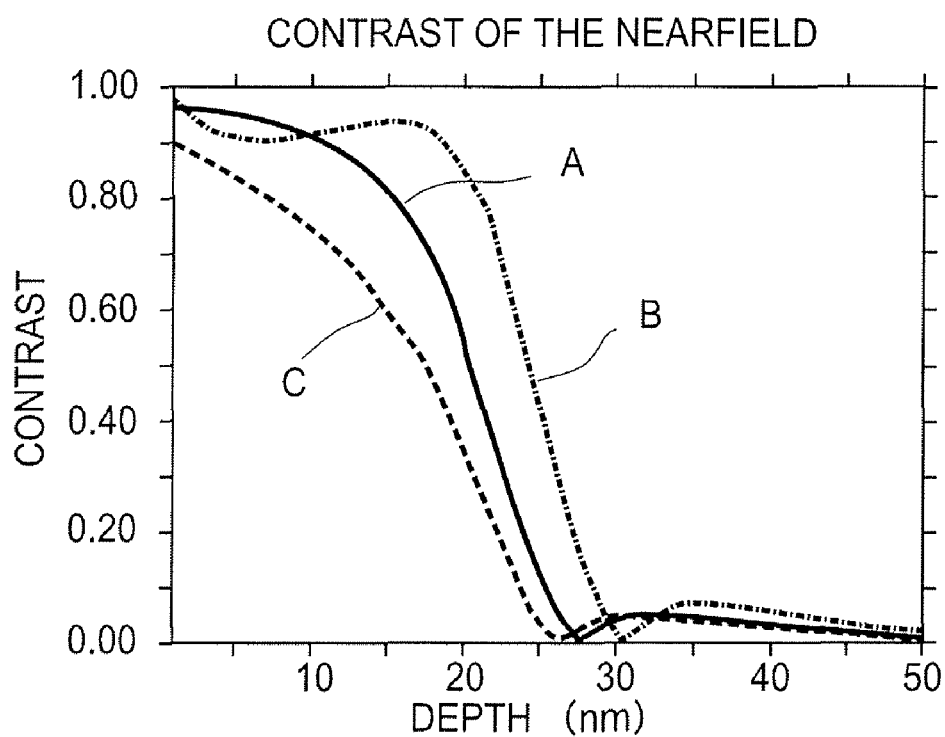
FIG. 2 is a graph showing the results of analyses made to the exposure contrast based on the near-field exposure method in an embodiment of the present invention.

FIG. 2 shows the results of analyses made to the near-field on the basis of these models.

Here, the analyses were made with reference to an example of exposure using a mask having a chromium film formed with small openings having a period of sixty-four nm and an opening width of sixteen run.

The graph was made by plotting, for a distance inside the resist from the mask, the contrast with respect to the depth. Here, the contrast C at a certain depth is the quantity that can be defined based on the maximum $I_{max}$ of the light intensity at that depth and the minimum $I_{min}$ of the light intensity, as follows.

$C=(I_{max}-I_{min})/(I_{max}+I_{min})$.

For the liquid, pure water having a refractive index of 1.342 with respect to the light having a wavelength of 365 nm was used. The refractive index of the photoresist was 1.628.

Here, the solid line corresponds to model A, and the dash-and-dot line corresponds to model B. On the other hand, the broken line corresponds to model C.

It is seen that, as compared with model C, wherein the gap was filled with air, when the gap was filled with water, good contrast could be held at deeper depths, and that at 20 nm depth, for example, a contrast of 0.5 was being achieved.

By performing the near-field exposure based on such a structure described above, good contrast produced by the mask near-field can be kept at deeper depths inside the resist. As a result of this, an intermediate zone between a dissolved zone and a non-dissolved zone in the developing process can be made smaller. Therefore, a resist pattern of a small line-edge roughness is obtainable.

By transferring the resist pattern thus produced to substrates of various materials, device structures having a size of 100 nm or less can be produced.

The exposure method of the present invention can be applied to the manufacture of specific microdevices, such as follows, for example.

(1) a quantum dot laser device where the method is used for production of a structure in which GaAs quantum dots of a 50 nm size are arrayed two-dimensionally at 50 nm intervals;

(2) a sub-wavelength element (SWS) structure having an antireflection function, where the method is used for production of a structure in which conical $SiO_2$ structures of 50 nm size are arrayed two-dimensionally at 50 nm intervals on a $SiO_2$ substrate;

(3) a photonic crystal optics device or a plasmon optical device where the method is used for production of a structure in which structures of a 100 nm size, made of GaN or metal, are arrayed two-dimensionally and periodically at 100 nm intervals;

(4) a biosensor or a micro-total analyzer system (μTAS) based on local plasmon resonance (LPR) or a surface enhancement Raman spectrum (SERS), where the method is used for the production of a structure in which Au fine particles of a 50 nm size are arrayed two-dimensionally upon a plastic substrate at 50 nm intervals; and (5) a nano-electromechanical system (NEMS) device, such as an SPM probe, for example, where the method is used for the production of a radical structure of a 50 nm size or under, to be used in a scanning probe microscope (SPM), for example.

Next, a specific working example of the present invention will be described.

In this example, for the liquid layer to be sandwiched in the gap between the substrate and the mask, a high refractive-index liquid material, having a refractive index higher than the water and close to the resist of the photosensitive layer, may be used.

Figure 3:
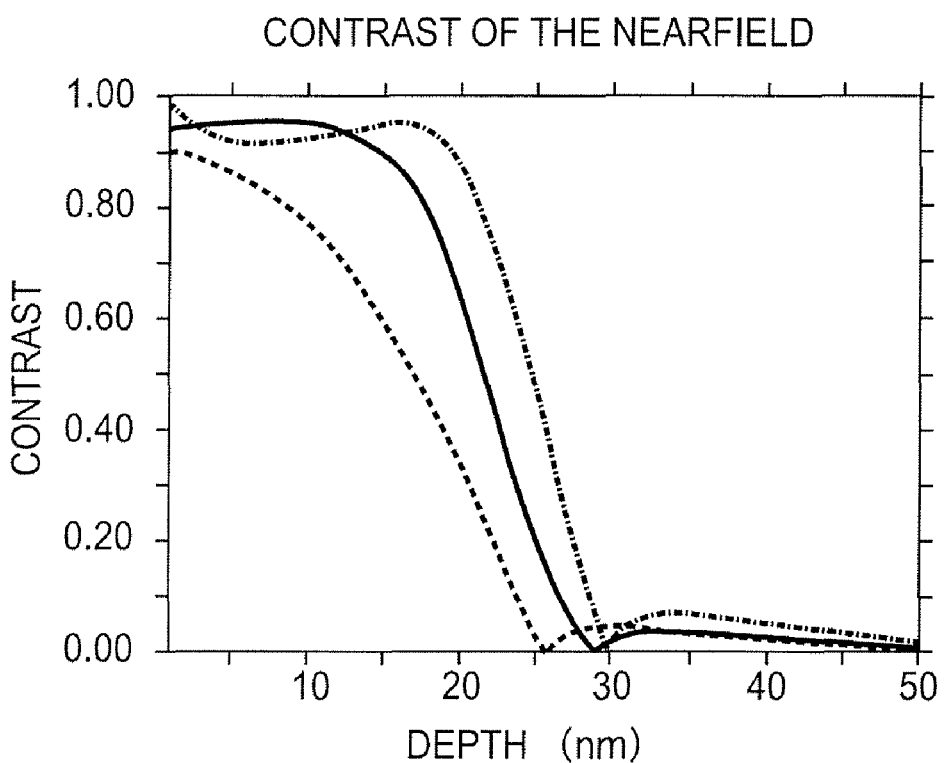
FIG. 3 is a graph showing the results of analyses made to the exposure contrast in an embodiment of the present invention.

FIG. 3 shows the results of analyses made in regard to the contrast when a mask and a resist are brought into contact with each other through a high refractive-index liquid having a refractive index of 1.63.

The resist thickness was 130 nm. It is seen that, as shown in a solid line in the graph, as compared with the case where the liquid is water (solid line in FIG. 2), the depth where a good contrast of 0.5 is maintained is deepened more. Furthermore, the contrast in shallow regions from 0-15 nm in depth is improved, such that the contrast curve has become very close to the contrast profile of direct contact, shown by the dash-and-dot line in FIG. 3.

By performing the near-field exposure based on such a structure as described above, good contrast produced by the mask near-field can be kept at deeper depths inside the resist.

Furthermore, the difference of contrast profile, between the portion where the mask and the resist are in direct contact with each other and the portion where a liquid intervenes therebetween, can be held small. Hence, the limitation concerning the state of contact can be loosened, and the process latitude can be widened.

While the invention has been described with reference to the structures disclosed herein, it is not confined to the details set forth, and this application is intended to cover such modifications or changes as may come within the purposes of the improvements or the scope of the following claims.

This application claims priority from Japanese Patent Application No. 2006-158012, filed Jun. 7, 2006, which is hereby incorporated by reference herein.

What is claimed is:

1. A near-field exposure method, comprising:
providing an exposure mask having (i) a blocking film with small openings formed on a supporting material and (ii) a photoresist layer, formed on a substrate, having surface unevenness that ranges from 10 nm to 1 μm in height of the substrate;
supplying a liquid onto the photoresist layer;
closely contacting the exposure mask to the photoresist layer such that, in a portion of the photoresist layer at its top in height, the liquid is pushed aside and the light blocking film and the photoresist layer directly contact each other; and
projecting exposure light of an exposure light source onto the exposure mask so that the photoresist is exposed, based on near-field light escaping from the small openings,
wherein the near-field exposure is carried out under a condition that (i) a contact region where the light blocking film and the photoresist layer are in contact with each other and (ii) a liquid region filled with the liquid between the light blocking film and the photoresist layer, coexist, between the light blocking film and the photoresist layer.

2. A method according to claim 1, wherein the coexistence of the contact region and the liquid region is provided by a process that includes forming a film of liquid on the photoresist layer, and shifting the light blocking film toward the photoresist film until a portion of the light blocking film pushes aside the film of liquid and directly contacts the photoresist layer, while confining the film of liquid in an interspace remaining between the light blocking film and the photoresist layer coming closer to each other.

3. A method according to claim 1, wherein the photoresist layer of the substrate is comprised of a shape buffer layer for reducing the surface unevenness, and a photosensitive resist layer formed on the shape buffer layer.

4. A method according to claim 3, wherein, based on the reducing of the surface unevenness by the shape buffer layer, a level difference of the surface unevenness of the substrate is reduced to at most a half of a reachable depth of the near-field from the exposure mask, in an upper limit value.

5. A method according to claim 1, wherein the liquid is a transparent liquid.

6. A device manufacturing method, comprising:
an exposure step based on a near-field exposure method as recited in claim 1;
a developing step for developing a photoresist layer exposed in said exposure step, to provide a transfer mask; and
a processing step for processing a substrate by use of the transfer mask provided in said developing step.

* * * * *